United States Patent
Sugiyama et al.

(10) Patent No.: US 7,333,564 B2
(45) Date of Patent: Feb. 19, 2008

(54) HIGH FREQUENCY POWER AMPLIFIER CIRCUIT

(75) Inventors: Hiroki Sugiyama, Takasaki (JP); Takashi Soga, Takasaki (JP); Yusuke Shimamune, Takasaki (JP); Shuji Tomono, Saku (JP); Tomio Furuya, Tamamura (JP); Kyoichi Takahashi, Fujioka (JP)

(73) Assignee: Renesas Technology Corp., Tokyo (JP)

( * ) Notice: Subject to any disclaimer, the term of this patent is extended or adjusted under 35 U.S.C. 154(b) by 568 days.

(21) Appl. No.: 11/024,708

(22) Filed: Dec. 30, 2004

(65) Prior Publication Data

US 2005/0146379 A1    Jul. 7, 2005

(30) Foreign Application Priority Data

Jan. 5, 2004   (JP)  ............................ 2004-000170
May 28, 2004   (JP)  ............................ 2004-158689

(51) Int. Cl.
*H04L 25/03*   (2006.01)
(52) U.S. Cl. .................... 375/297; 375/146; 455/13.4; 455/115.3; 455/127.1; 330/127
(58) Field of Classification Search ........ 375/295–297, 375/146, 285; 455/13.4, 91, 127.1, 127.2, 455/115.1, 115.3; 330/127, 129, 130
See application file for complete search history.

(56) References Cited

U.S. PATENT DOCUMENTS

| | | | | |
|---|---|---|---|---|
| 5,129,098 A | * | 7/1992 | McGirr et al. | ................ 455/69 |
| 5,334,979 A | * | 8/1994 | Hatakeyama | ............... 341/138 |
| 6,625,429 B1 | * | 9/2003 | Yamashita | .................. 455/126 |
| 6,642,784 B2 | * | 11/2003 | McMorrow | ................. 330/129 |

FOREIGN PATENT DOCUMENTS

JP   2000-151310   5/2000

* cited by examiner

*Primary Examiner*—Dac V. Ha
(74) *Attorney, Agent, or Firm*—Mattingly, Stanger, Malur & Brundidge, P.C.

(57) ABSTRACT

The present invention provides a high frequency power amplifier circuit capable of obtaining sufficient detection output even in a range where a request output power level is low and performing a desired output power control by a control loop with the detection output in a radio communication system which detects output power and performs feedback control. An output power detection circuit which detects the level of output power on the basis of an AC signal supplied from a final amplification stage of a high frequency power amplification circuit via a capacitive element has a circuit configuration such that in a state where the output power control voltage is lower than a certain level, current (Isu) according to the output power control voltage is generated and supplied to the output power detection circuit, and detection sensitivity of the output power detection circuit improves according to the current.

12 Claims, 9 Drawing Sheets

HIGH FREQUENCY POWER AMPLIFIER CIRCUIT

CROSS-REFERENCE TO RELATED APPLICATION

The present application claims priority from Japanese patent application Nos. 2004-158689 filed on May 28, 2004 and 2004-000170 filed on Jan. 5, 2004, the content of which is hereby incorporated by reference into this application.

BACKGROUND OF THE INVENTION

The present invention relates to a technique effective when applied to an electronic part having a high frequency power amplifier circuit assembled therein, used for a radio communication system such as a mobile cellular phone and for amplifying a high frequency transmission signal and outputting the amplified signal, and more particularly, to a technique effective when used for a circuit for detecting output power necessary for an output power feedback control.

Generally, in a transmission-side output part in a radio communication system (mobile communication system) such as a mobile cellular phone, a high frequency power amplifier circuit for amplifying a modulated transmission signal is provided. In a conventional radio communication system, to control the amplification factor of the high frequency power amplifier circuit in accordance with a transmission request level from a control circuit such as a baseband circuit or a microprocessor, the output power of the high frequency power amplifier circuit or an antenna is detected and fed back (refer to, for example, Japanese Unexamined Patent Publication No. 2000-151310). Hitherto, the output power is generally detected by using a coupler, a detector, or the like. The detector is often constructed in a semiconductor integrated circuit separate from the high frequency power amplifier circuit or as a discrete part.

SUMMARY OF THE INVENTION

In a conventional method of detecting the output power of a high frequency power amplifier circuit using a coupler, the size of the coupler itself is large and a diode for detecting the detection output is necessary. A number of semiconductor integrated circuits and electronic parts separate from the high frequency power amplifier circuit are used, so that it is difficult to reduce the size of the module. When the coupler is used, there is an inconvenience such that a power loss is relatively large.

Further, as a mobile cellular phone in recent years, a dual-band type mobile cellular phone is proposed, which can handle not only a signal of the system called GSM (Global System for Mobile Communication) using frequencies in the band of 880 to 915 MHz but also a signal of the system such as the DCS (Digital Cellular System) using frequencies in the band from 1710 to 1785 MHz. In a high frequency power amplifier module used in such a mobile cellular phone, an output power amplifier is provided for each of the bands, so that a coupler or detector for detecting the output power of the output power amplifier is necessary for each of the bands. Consequently, it becomes more difficult to miniaturize the module.

Among characteristics requested of the circuit for detecting the output power of the high frequency power amplifier circuit in a radio communication system, particularly important characteristics are the following five characteristics. First, the circuit is to be small. Second, the circuit is to be highly sensitive. Third, an insertion loss of the circuit is to be low. Fourth, the circuit is not susceptible to a change in use environments such as a fluctuation in power source voltage or a change in temperature. Fifth, the circuit should not make abnormal current flow to the power amplifier circuit due to mismatch between an actual output state of the power amplifier circuit and output control by feedback control, causing destruction of the power amplifier circuit. The conventional detecting method using a coupler meets the demands of the second, fourth, and fifth characteristics more or less but does not sufficiently address the requirements on the miniaturization of the first characteristic and the low insertion loss of the third characteristic.

The applicant of the present invention has achieved and filed an invention, as a method of detecting output power of a high frequency power amplifier circuit without using a coupler, such that an alternate current component in the output power is extracted via a capacitive element from some midpoint of an impedance matching circuit connected at the post stage of the final amplification stage of the high frequency power amplifier circuit and detected by an output power detecting circuit (Japanese Patent Application No. 2003-123040).

The output power detecting circuit of the invention filed prior to the present invention is more advantageous than the detecting method using a coupler with respect to miniaturization and a low insertion loss. However, with low power, that is, in a range where a requested output power level is low, the detection sensitivity is low and sufficient detection voltage cannot be obtained, so that a desired power control cannot be performed. Concretely, it was clarified that there is the following problem. In a range where detected voltage is low, the detected voltage is close to "0", so that nothing is fed back and the feedback control loop which compares the output power level instruction signal Vramp supplied from the baseband part with the detection voltage from the output power detection circuit and controls the bias voltage, that is, the gain of the high frequency power amplifier circuit in accordance with the potential difference functions like an open loop. As shown by the broken line B in FIG. 6, the level of output power Pout becomes suddenly high and a desired power control cannot be performed.

An object of the present invention is to provide an output power detection circuit capable of obtaining sufficient detection output even in a range where a requested output power level is low in a radio communication system which detects output power and performs a feedback control.

Another object of the present invention is to provide a high frequency power amplifier circuit capable of performing a desired output power control by a control loop even in a range where a requested output power level is low in a radio communication system which detects output power and performs a feedback control, and an electronic part for high frequency power amplification using the same.

The above and other objects and novel features of the present invention will become apparent from the description of the specification and appended drawings.

The outline of representative ones of inventions disclosed in the application will be described as follows.

In output power detection circuit which detects a level of an output power on the basis of an AC signal received from an output part (from the final amplification stage to an output terminal) of a high frequency power amplifier circuit via a coupling capacitor, on the basis of output power control voltage and reference voltage, in a state where output power control voltage is lower than a predetermined level, current according to the output power control voltage is generated and supplied to the output power detection circuit, and the detection sensitivity of the output power detection circuit improves according to the supplied current.

More concretely, the output power detection circuit includes: a transistor for output detection which receives, by its control terminal, an alternate current signal supplied from the output part of the high frequency power amplifier circuit via the coupling capacitor and makes current proportional to the output power flow; a bias generating circuit for giving an operation point to a control terminal of the transistor; a current mirror circuit for transferring current flowing in the transistor for output detection; and a current-voltage converting circuit for converting the transferred current to voltage. In addition, a current generating circuit for generating output power control voltage is provided. By making the generated current flow to the current-voltage converting circuit in the output power detection circuit, the detection sensitivity of the output power detection circuit in a state where the output power control voltage is low is improved.

With the means, the detection sensitivity of the output power detection circuit in a state where the output power control voltage is low is improved. Thus, a situation can be avoided such that the output power detection level in the low power range where the requested output power level is low decreases and the output power control loop becomes open, so that the output power can be prevented from becoming excessively high. In the case of constructing a circuit for detecting output power by using a coupling capacitor in place of a coupler, a situation such that the detection sensitivity of output power decreases in the low power range and desired output power control cannot be performed is avoided, and the detection circuit can be miniaturized.

Effects obtained by representative ones of the inventions disclosed in the application will be briefly described as follows.

According to the invention, in a radio communication system which has an output power detection circuit for detecting level of output power on the basis of an AC signal supplied from an output part of a high frequency power amplifier circuit via a coupling capacitor, and performs feedback control of bias voltage of the high frequency power amplifier circuit on the basis of an output detected by the output power detection circuit, a sufficient detection output can be obtained also in a range where a requested output power level is low. Thus, also in the range where the requested output power level is low, desired output power control with a control loop can be performed.

DETAILED DESCRIPTION OF PREFERRED EMBODIMENTS OF THE INVENTION

Preferred embodiments of the invention will be described hereinbelow with reference to the drawings.

First Embodiment

Figure 1:
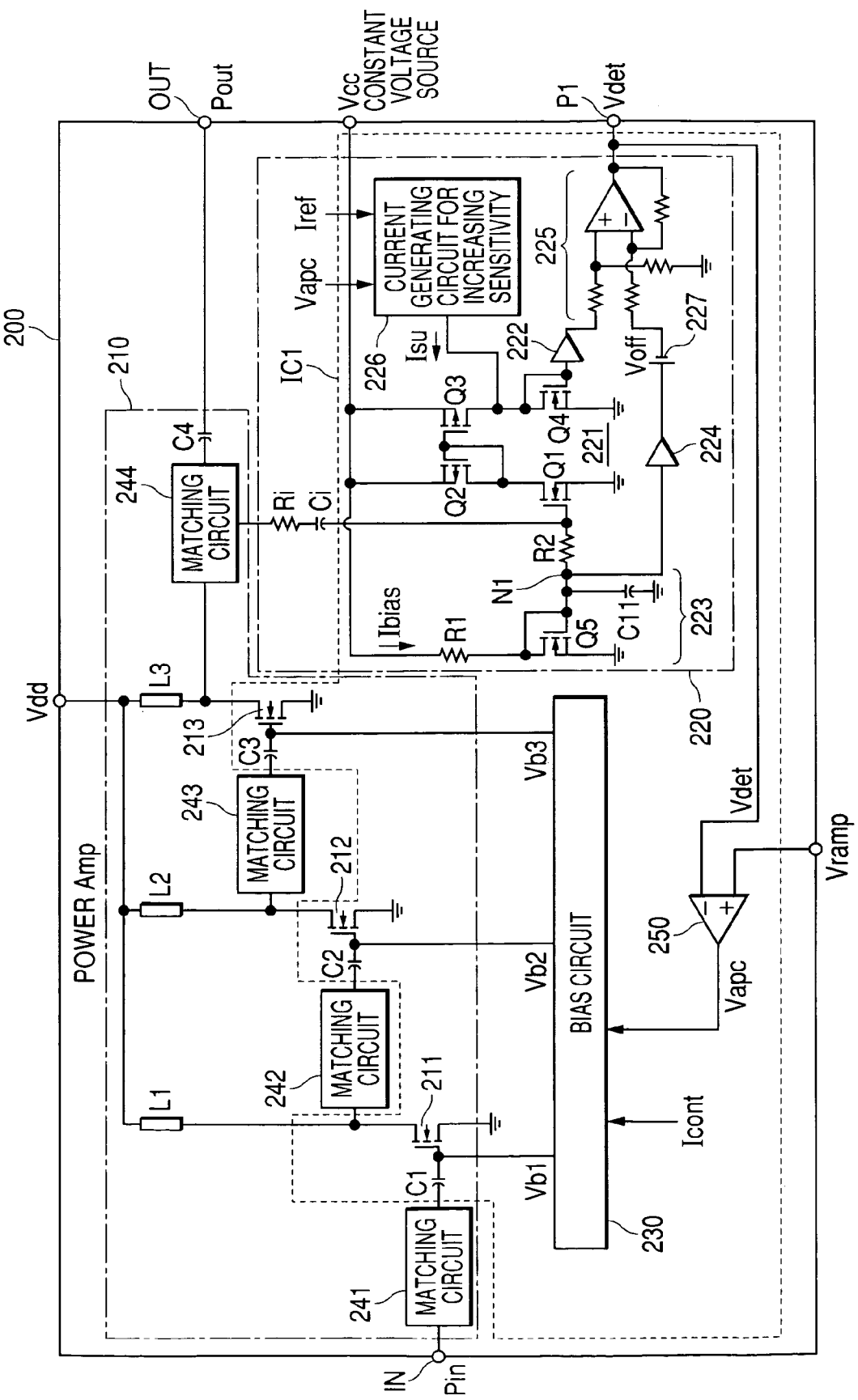
FIG. 1 is a circuit configuration diagram showing a first embodiment of an output power detection circuit according to the invention and a high frequency power amplifier (power module) to which the output power detection circuit is applied.

FIG. 1 shows an embodiment of a high frequency power amplifier (hereinbelow, called power module) to which an output power detection circuit of the invention is applied. In the specification, a structure constructed so as to be handled as a single electronic part by mounting a plurality of semiconductor chips and discrete parts on an insulating substrate such as a ceramic board on/in which print wiring is conducted and connecting the parts via the print wiring and bonding wires so that each part plays a predetermined role is called a module.

A power module 200 of the embodiment has a high frequency power amplifier 210 including a power amplification FET for amplifying an input high frequency signal Pin, an output power detection circuit 220 for detecting output power of the high frequency power amplifier 210, a bias circuit 230 for applying a bias voltage to the power amplification FET in each of stages of the high frequency power amplifier 210, thereby controlling idle current to be made to flow to each of the FETs, and an error amplifier (APC) 250 for comparing an output power level instruction signal Vramp supplied from an external baseband unit with a detected voltage Vdet from the output power detection circuit 220 and applying control voltage Vapc according to the potential difference to the bias circuit 230.

Although not particularly limited, the high frequency power amplifier 210 of the embodiment has three FETs 211, 212, and 213 for power amplification. The gate terminals of the FETs 212 and 213 in the post stages are connected to the drain terminals of the FETs 211 and 212 in the ante stages, respectively, and the FETs 211, 212, and 213 are constructed as a whole as an amplification circuit having three stages. Gate bias voltages Vb1, Vb2, and Vb3 supplied from the bias circuit 230 are applied to the gate terminals of the FETs 211, 212, and 213 in the stages, respectively, and idle currents according to the voltages flow to the FETs 211, 212, and 213.

In the embodiment, as the transistors 211 to 213 for amplification, MOS transistors called LDMOS (Laterally Diffused MOSFETs) such that electrodes are spread in the lateral direction on a chip are used. A MOS transistor Q1 for detection and a MOS transistor Q4 for voltage conversion in the output power detection circuit 220 take the form of LDMOSs having the same structure as the transistors 211 to 213 for amplification. With the configuration, even if the characteristics of the transistors 211 to 213 for amplification vary due to variations in manufacture, the transistors Q1 and Q4 vary similarly. Thus, precision of the detected voltage Vdet can be increased.

To the drain terminals of the FETs 211, 212, and 213 of the stages, power source voltage Vdd is applied via inductors L1, L2, and L3, respectively. Between the gate terminal of the FET 211 of the first stage and an input terminal In, an impedance matching circuit 241 and a capacitive element C1 for blocking direct current are provided. The high frequency signal Pin is input to the gate terminal of the FET 211 via the circuit and the element.

Between the drain terminal of the FET 211 in the first stage and the gate terminal of the FET 212 in the second stage, an impedance matching circuit 242 and a capacitive element C2 for blocking direct current are connected. Between the drain terminal of the FET 212 in the second stage and the gate terminal of the FET 213 in the final stage, an impedance matching circuit 243 and a capacitive element C3 for blocking direct current are connected. The drain terminal of the FET 213 in the final stage is connected to an output terminal OUT via an impedance matching circuit 244 and a capacitive element C4, and a signal Pout obtained by blocking the direct current component in the high frequency input signal Pin and amplifying the alternate current component is output.

The output power detection circuit 220 is constructed by a detector 221, a buffer circuit 222, a bias generating circuit 223, a buffer circuit 224, a subtraction circuit 225, and a current generating circuit 226 for increasing sensitivity. The detector 221 includes a resistor Ri whose one of terminals is connected to an internal node of the impedance matching circuit 244 provided between the drain terminal of the power amplification FET 213 in the final stage and the output terminal OUT of the module, a capacitor Ci connected in series to the resistor Ri, an N-channel MOS transistor Q1 having a gate to which the other terminal of the capacitor Ci is connected, a P-channel MOS transistor Q2 connected in series to the transistor Q1, a MOS transistor Q3 connected to the transistor Q2 so as to form a current mirror, and a MOS transistor Q4 for current-voltage conversion connected in series to the transistor Q3. The buffer circuit 222 impedance-converts the voltage obtained by the MOS transistor Q4 and supplies the resultant voltage to the next stage. The bias generating circuit 223 applies a gate bias voltage to the MOS transistor Q1. The buffer circuit 224 impedance-converts the bias voltage generated by the bias generating circuit 223 and supplies the resultant to the next stage. The subtraction circuit 225 outputs a voltage obtained by subtracting the output of the buffer circuit 224 from the output of the buffer circuit 222. The current generating circuit 226 for increasing sensitivity improves detection sensitivity of the output power detection circuit 220 in a state where the output power is low by making current flow to the drain of the MOS transistor Q4 for current-voltage conversion. As the buffer circuits 222 and 224, voltage followers can be used.

A preferred resistance value of the resistor Ri is about 30 to 3 kΩ and a preferred capacitance value of the capacitor Ci is about 2 to 100 pF. In the case of extracting a voltage for monitoring the output power of the high frequency power amplifier circuit from the impedance matching circuit, it is sufficient to extract alternate current components, so that only the capacitive element may be sufficient. However, by providing the resistive element Ri between the capacitive element and the connection node of the impedance matching circuit, the capacitor Ci after the resistor Ri is not seen from the transistor 213 for power amplification in the final stage, so that an insertion loss of a coupling capacitor can be reduced.

The bias generating circuit 223 has a resistor R1 and a MOS transistor Q5 connected in series between the power source terminal to which voltage Vcc from a constant voltage source is applied and a ground point, a resistor R2 connected between the gate terminal of the MOS transistor Q5 and the gate terminal of the MOS transistor Q1 for output detection, and a capacitor C11 connected between the gate terminal of the MOS transistor Q5 and the ground point. The gate terminal and the drain terminal of the MOS transistor Q5 are connected to each other so that the MOS transistor Q5 acts as a diode. The potential at N1 is determined by current Ibias flowing in the resistor R1 and the transistor Q5 and is applied as bias voltage to the gate terminal of the MOS transistor Q1 for output detection.

In the embodiment, as the value of the bias voltage, a voltage value close to a threshold voltage of Q1 is set so that the MOS transistor Q1 for output detection can perform class B amplifying operation. Therefore, current proportional to the alternate current waveform which is input via the capacitor Ci and obtained by dividing the alternate current waveform into halves is made to flow to the MOS transistor Q1, and the drain current of Q1 includes a direct current component proportional to the amplitude of an input alternate current signal.

The drain current Id of the transistor Q1 is transferred to the Q3 side by the current mirror circuit constructed by Q2 and Q3 and is converted to a voltage by the diode-connected transistor Q4. The MOS transistors Q1 and Q4 and the MOS transistors Q2 and Q3 are set at a predetermined size ratio. With the configuration, for example, when the characteristics (particularly, the threshold voltages) of the MOS transistors Q1 and Q2 vary due to manufacturing variations, the characteristics of the MOS transistors Q4 and Q3 paired with the MOS transistors Q1 and Q2, respectively, vary similarly. As a result, the influence of the characteristic variation is cancelled off, and an output detection voltage which is not influenced by the variations in the MOS transistors appears at the drain terminal of the MOS transistor Q4.

In the embodiment, the potential at the connection node N1 between the gate terminal of the MOS transistor Q5 of the bias generating circuit 223 and the resistor R2 is supplied to the input terminal of the buffer circuit 224. The resistor R2 and the capacitor C11 function as a low-pass filter for preventing the alternate current components in the output power received via the capacitor Ci from being included in the input of the buffer circuit 224. Preferably, the resistance value of the resistor R2 is about 10 k to 30 kΩ and the capacitance value of the capacitor C11 is about 10 to 50 pF.

In the embodiment, the same voltage as the bias voltage generated by the bias generating circuit 223 and applied to the gate terminal of the MOS transistor Q1 for output detection is supplied to the subtraction circuit 225 via the buffer circuit 224, and a voltage obtained by subtracting the bias voltage from the output detection voltage is output from the subtraction circuit 225. Therefore, an output of the subtraction circuit 225 is the detected voltage Vdet proportional to the alternate current component in pure output power which does not include the direct current component applied by the bias generating circuit 223.

In the output power detection circuit 220 of the embodiment, a voltage source 227 for giving a direct current offset Voff is provided in the ante stage of the buffer 224 for transmitting the bias voltage generated by the bias generating circuit 223 to the subtraction circuit 225 to slightly decrease the potential of the inversion input terminal of the amplifier of the subtraction circuit 225 for the following reason. There is a case such that even when an attempt is made to set the output level to "0" as the characteristic of the baseband circuit for supplying the output level instruction signal Vramp, the signal Vramp of perfectly 0V cannot be output. In such a case, if the voltage Vdet supplied from the output power detection circuit 220 to the inversion input terminal of the error amplifier 250 is 0V, the output control voltage Vapc becomes higher than 0V and there is the possibility that the output power Pout is output. Alternately, the direct current voltage source 227 may be provided between the buffer 224 and the subtraction circuit 225.

A portion surrounded by the broken line in the power module 200 of the embodiment is formed as a semiconductor integrated circuit. Specifically, the elements of the power amplifier 210 (except for the inductors L1 to L3 and the impedance matching circuit 244), the elements of the bias circuit 230, the elements of the output power detection circuit 220 (except for the resistor Ri and the capacitor Ci), and the capacitive elements C1, C2, and C3 for blocking direct current components are formed as a semiconductor integrated circuit IC1 on a single semiconductor chip made of single crystal silicon or the like. The semiconductor integrated circuit IC1, inductors L1 to L3 of the power amplifier 210, and the resistor Ri and the capacitive element Ci of the output power detection circuit 220 are mounted on a single ceramic substrate, thereby constructing a power module. The inductors in the impedance matching circuits 241 to 244 can be formed by bonding wires connected between pads of the semiconductor chip or micro strip lines formed on a module board.

Since no coupler is used in the power module to which the output power detection method of the embodiment is applied, the module can be miniaturized. In addition, the output power detection circuit 220 is easily formed together with the main components of the power amplifier 210 and the bias circuit 230 into a semiconductor integrated circuit, so that the number of parts can be decreased and the module can be miniaturized. Although not particularly limited, in the embodiment, in spite of the fact that the error amplifier (APC) 250 is formed on the same semiconductor chip on which the power amplifier 210 and the output power detection circuit 220 are also formed, an external terminal P1 for outputting the detection voltage Vdet detected by the output power detection circuit 220 to the outside of the chip is provided. The external terminal P1 can be used, for example, for measuring variations in sensitivity of the output power detection circuit 220 after manufacture or checking an open-loop characteristic of a control system.

Figure 2:
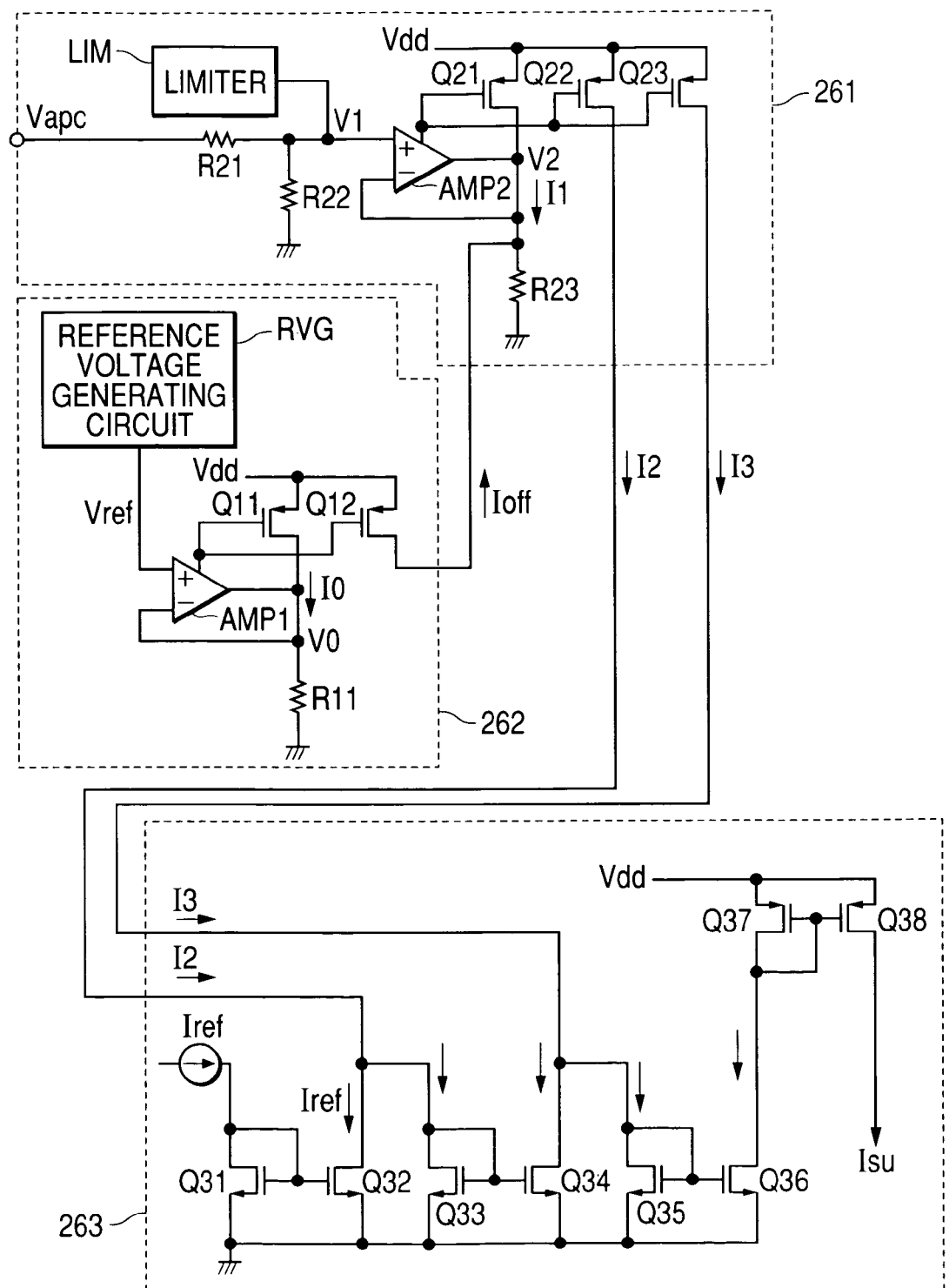
FIG. 2 is a circuit configuration diagram showing a concrete circuit example of a current generating circuit for increasing sensitivity as a component of an output power detection circuit.

FIG. 2 shows a concrete circuit example of the current generating circuit 226 for increasing sensitivity in the output power detection circuit 220.

The current generating circuit 226 for increasing sensitivity of the embodiment has: a variable current generating circuit 261 for receiving the output control voltage Vapc supplied from the error amplifier 250 to the bias circuit 230 and generating predetermined currents I2 and I3 in accordance with the level of Vapc; a constant current generating circuit 262 for generating an offset current Ioff of predetermined magnitude (=constant current) on the basis of the reference voltage; and a current combining circuit 263 for combining the currents I2 and I3 generated by the variable current generating circuit 261 with the current Ioff generated by the constant current generating circuit 262, thereby generating current Isu for increasing sensitivity to be made to flow to the drain of the MOS transistor Q4.

The constant current generating circuit 262 is constructed by a reference voltage generating circuit RVG for generating reference voltage Vref having no power source dependency such as a band gap reference circuit, a differential amplifier AMP1 having a non-inversion input terminal to which the generated reference voltage Vref is applied, a MOS transistor Q11 and a resistor R11 connected in series between the power source voltage Vdd and the ground point, and a MOS transistor Q12 having a gate receiving the same gate voltage as that of the MOS transistor Q11 and making current proportional to the drain current of Q11 flow. The transistor Q11 and the resistor R11 can be regarded as an output stage of the differential amplifier AMP1.

In the constant current generating circuit 262 of the embodiment, a potential V0 of the connection node between the transistor Q11 and the resistor R11 is fed back to the inversion input terminal of the differential amplifier AMP1, thereby making flow constant current I0 which makes the potential V0 match with the reference voltage Vref to the MOS transistor Q11. The gate width of the transistor Q11 and that of the transistor Q12 are set at a predetermined size ratio so that the constant current Ioff proportional to I0 flows to the transistor Q12 and is supplied to the variable current generating circuit 261.

The variable current generating circuit 261 is constructed by resistors R21 and R22 for generating a voltage reduced in proportion to the output control voltage Vapc, a limiter LIM for limiting the upper limit of a voltage V1 divided by the resistors R21 and R22 to Vlim, a differential amplifier AMP2 having the non-inversion input terminal to which the voltage V1 divided by the resistors R21 and R22 is applied, a MOS transistor Q21 and a resistor R23 connected in series between the power source voltage Vdd and the ground point, and MOS transistors Q22 and Q23 receiving the same gate voltage as that of the MOS transistor Q21 by their gates and making flow current proportional to the drain current of the MOS transistor Q21.

In the variable current generating circuit 261 of the embodiment, potential V2 of the connection node between the transistor Q21 and the resistor R23 is fed back to the inversion input terminal of the differential amplifier AMP2, thereby making flow the constant current I1 which makes the potential V2 match with the input voltage V1 to the MOS transistor Q21. The constant current I1 becomes current which linearly changes according to the input voltage Vapc in the range of V1<Vlim. To the connection node between the transistor Q21 and the resistor R23, the constant current Ioff generated by the constant current generating circuit 262 is made to flow.

Figure 3A:
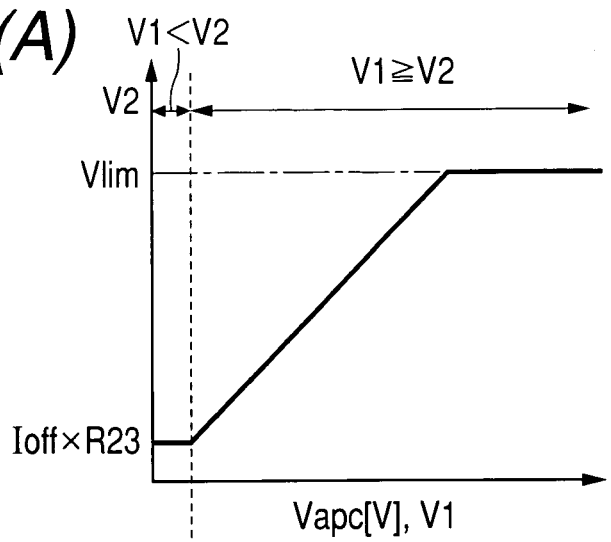
FIG. 3A is a graph showing the relation between output control voltage Vapc in the current generating circuit for increasing sensitivity of the first embodiment and internal voltage V2.
Figure 3B:
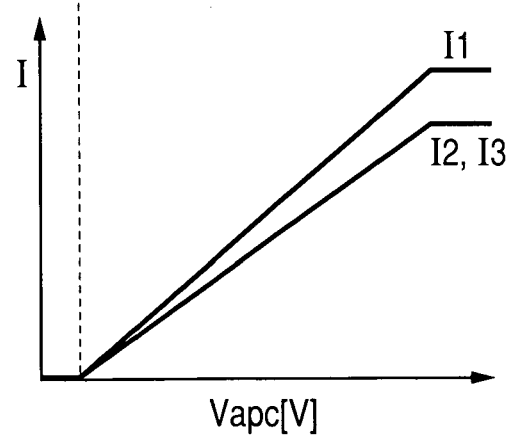
FIG. 3B is a graph showing the relation between the output control voltage Vapc and internal currents I1 to I3.

Consequently, as shown in FIG. 3A, the potential V2 at the connection node between the transistor Q21 and the resistor R23 is constant until the output V2 of the amplifier AMP2 reaches Ioff·R23 in accordance with the input voltage Vapc, is proportional to the input voltage Vapc in the range where V2 is equal to or larger than Ioff·R23, and is constant in the range where the limiter works. As a result, as shown in FIG. 3B, the current I1 flowing in the transistor Q21 is "0" in the range where V2 is equal to or smaller than Ioff·R23 and linearly increases in proportion to the input voltage Vapc in the range where V2 is equal to or higher than Ioff·R23. By setting the gate widths of the transistors Q21, Q22, and Q23 at a predetermined size ratio, the currents I2 and I3 proportional to I1 are made to flow to the transistors Q22 and Q23 and supplied to the current combining circuit 263 at the post stage. In the embodiment, by setting the transistors Q22 and Q23 to the same size, the currents I2 and I3 are set to be the same.

The current combining circuit 263 has a diode-connected MOS transistor Q31 whose source terminal is connected to the ground point and whose gate and drain are coupled to each other, a MOS transistor Q32 whose gate is connected to the gate of the transistor Q31, thereby constructing a current mirror circuit, a diode-connected MOS transistor Q33 whose drain is connected to the drain of the transistor Q32, a MOS transistor Q34 whose gate is connected to the gate of the transistor Q33, thereby constructing a current mirror circuit, a diode-connected MOS transistor Q35 whose drain is connected to the drain of the transistor Q34, a MOS transistor Q36 whose gate is connected to the gate of the transistor Q35, thereby constructing a current mirror circuit, a diode-connected P-channel MOS transistor Q37 connected to the transistor Q36 in series, and a MOS transistor Q38 whose gate is connected to the gate of the transistor Q37, thereby constructing a current mirror circuit.

The reference current Iref flows to the MOS transistor Q31, the current I2 generated by the variable current generating circuit 261 flows to the drain of the MOS transistor Q32 and, further, the current I3 generated by the variable current generating circuit 261 flows to the drain of the MOS transistor Q34. The MOS transistors Q31 to Q36 are formed in the same size, and the transistors Q37 and Q38 are also formed in the same size. With the configuration, when Iref<I2, current of I2-Iref flows to the transistor Q33. When Iref>I2, current does not flow to the transistor Q33. To the transistor Q35, current of I3-(I2-Iref) is made to flow.

Figure 4:
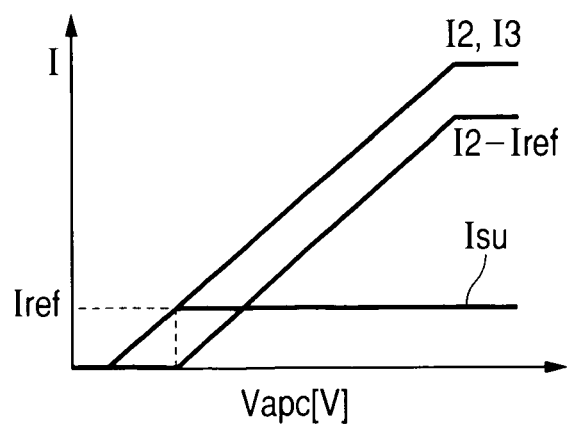
FIG. 4 is a graph showing the relation between the output control voltage Vapc and generated current Isu in the current generating circuit for increasing sensitivity of the first embodiment.

As described above, I2 is equal to I3. Therefore, when Iref<I3, the current Iref (constant current) flows to the transistor Q35. When Iref>I3, the current I3 flows. The current is transferred to the transistor Q36 and then to the transistor Q38 by the transistors Q37 and Q38 constructing the current mirror circuit, and output as the current Isu for increasing sensitivity. As a result, as shown by the solid line in FIG. 4, the current Isu for increasing sensitivity is equal to I3 (=I2) and gradually increases until the currents I2 and I3 reach Iref. When I2 and I3 become equal to or higher than Iref, the current Isu=Iref (=constant current) flows.

Figure 5:
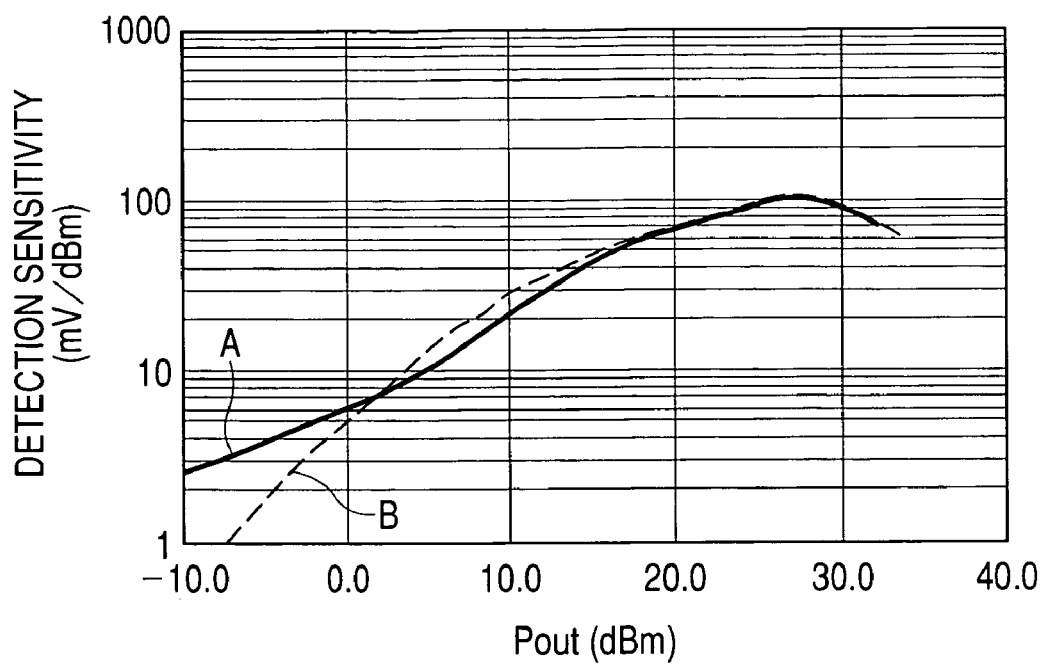
FIG. 5 is a graph showing the detection sensitivity characteristic of the output power detection circuit of the first embodiment and that of a conventional output power detection circuit.
Figure 6:
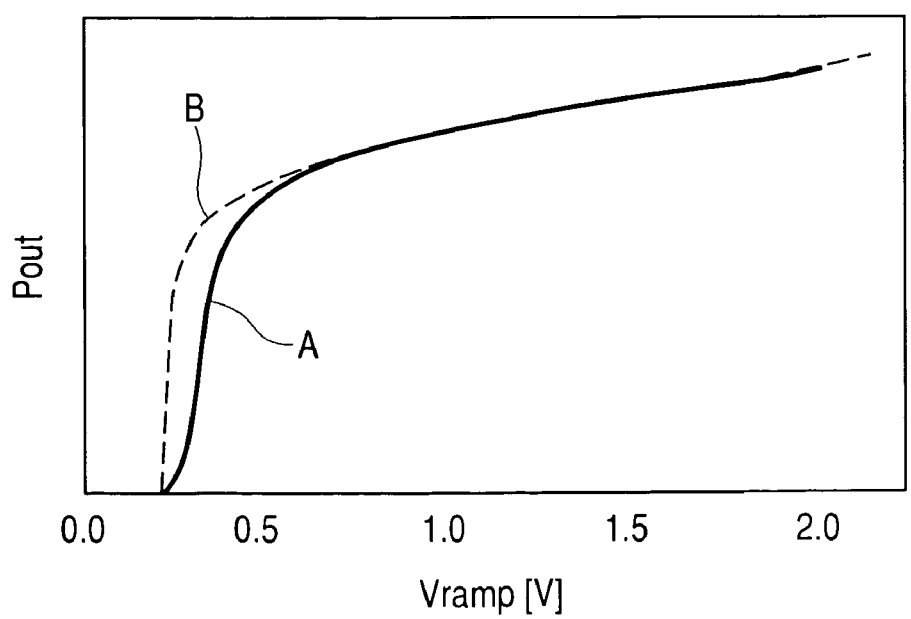
FIG. 6 is a graph showing the output power control characteristic of a power module to which the output power detection circuit of the first embodiment is applied and that of a power module to which a conventional output power detection circuit is applied.

When the current Isu flows to the drain in the MOS transistor Q4 in the output power detection circuit 220 in FIG. 1, the drain voltage of Q4 increases by the amount. Consequently, even when current flowing to the transistor Q3 according to an input via the capacitive element Ci is small, the detection sensitivity of the output power detection circuit 220 is higher as shown by the solid line A in FIG. 5 in a range where the output power is low. As a result, the detection voltage Vdet output from the output power detection circuit 220 and supplied to the error amplifier 250 is raised. As shown by the solid line A in FIG. 6, controllability on the output power Pout in the range where the output level instruction signal Vramp is low improves.

Second Embodiment

Figure 7:
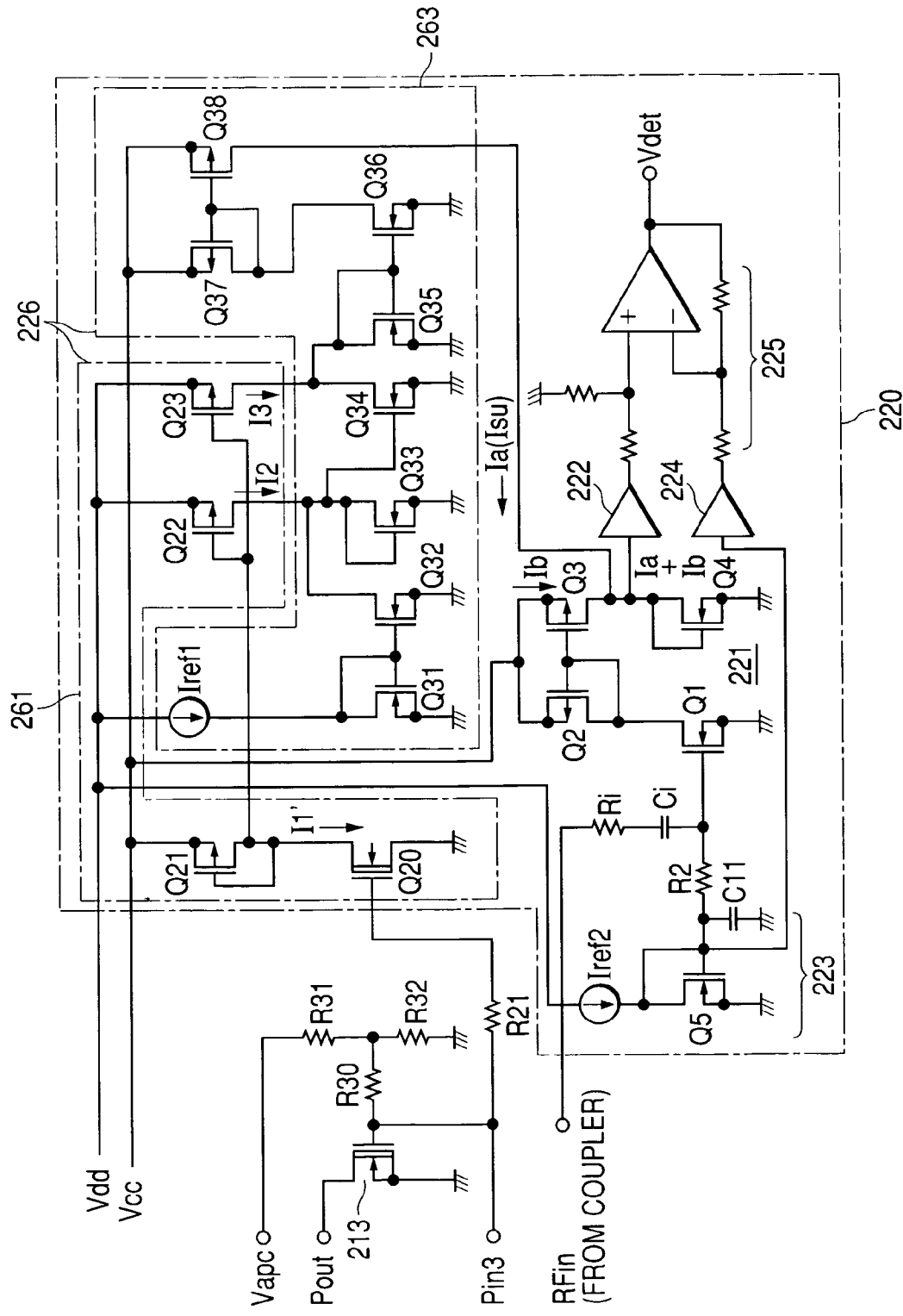
FIG. 7 is a circuit configuration diagram showing a second embodiment of an output power detection circuit according to the invention and a high frequency power amplifier (power module) to which the output power detection circuit is applied.

FIG. 7 shows a second embodiment of a power module to which the output power detection circuit of the invention is applied. In FIG. 7, the same reference numeral is designated to a circuit or device which is the same as that shown in FIGS. 1 and 2 and its description will not be repeated.

In the second embodiment, an operation point is given to the gate terminal of the transistor 213 for amplification in the final stage by a voltage obtained by dividing the output control voltage Vapc output from the error amplifier 250 by the resistors R31 and R32. Although not shown, an optimum operation point is given to each of the gate terminals of the transistors 211 and 212 for amplification in the first and second stages by a voltage obtained by dividing the output control voltage Vapc by the resistors at a different resistance ratio. In the second embodiment, the bias circuit 230 for applying the gate bias voltage of the transistors 211 to 213 for amplification is constructed by a resistive dividing circuit.

In the first embodiment, the current generating circuit 226 for increasing sensitivity is constructed to generate the current Isu for increasing sensitivity which flows to the detector 221 in the low power range on the basis of the output control voltage Vapc supplied from the error amplifier 250 to the bias circuit 230. In contrast, the first feature of the second embodiment is that the current generating circuit 226 for increasing sensitivity is constructed to generate current Ia (corresponding to Isu in the first embodiment) to be made to flow to the detector 221 on the basis of the gate input Pin3 of the FET 213 for amplification in the final stage.

The second feature of the second embodiment is that the transistor Q20 for detection whose gate receives a high frequency signal Pin3 to be input to the gate of the transistor 213 for amplification in the final stage and which makes current proportional to the drain current of the transistor 213 flow is formed by the same process as that of the transistor 213 for amplification in the final stage. Concretely, in the second embodiment, each of the transistors 211 to 213 for amplification is constructed by the above-described LDMOS and the transistor Q20 for detection is also constructed by an LDMOS having the same structure. With the configuration, even if the characteristic of the transistor 213 for amplification varies due to variations in manufacture, the characteristic of the transistor Q20 varies similarly, thereby enabling precision of detection current I1' to be increased.

In the current generating circuit 226 for increasing sensitivity of the second embodiment, the diode-connected MOS transistor Q21 is connected in series to the MOS transistor Q20 for detection. In a manner similar to the first embodiment, the gates of the transistors Q22 and Q23 for generating the currents I2 and I3 to be made to flow to the current combining circuit 263 are connected to the transistor Q21 so as to construct a current mirror circuit. When there is no input Pin3, the current I1' flowing in the transistor 213 for amplification and the MOS transistor Q20 for detection is current having a characteristic of the square of the output control voltage Vapc.

Consequently, the currents I2 and I3 flowing in the transistors Q22 and Q23 in the current generating circuit 226 for increasing sensitivity in FIG. 7 have a characteristic similar to that of I1'. As a result, the current Ia for increasing sensitivity flowing from the current generating circuit 226 for increasing sensitivity in the embodiment to the detector 221 becomes current which changes as shown by the broken line in FIG. 10. Current Ia+Ib obtained by adding the current Ia to the detection current Ib as shown by an alternate long and short dash line in FIG. 10 detected by the detector 221 is converted to a voltage, and the voltage is supplied to the subtraction circuit 225.

Figure 10:
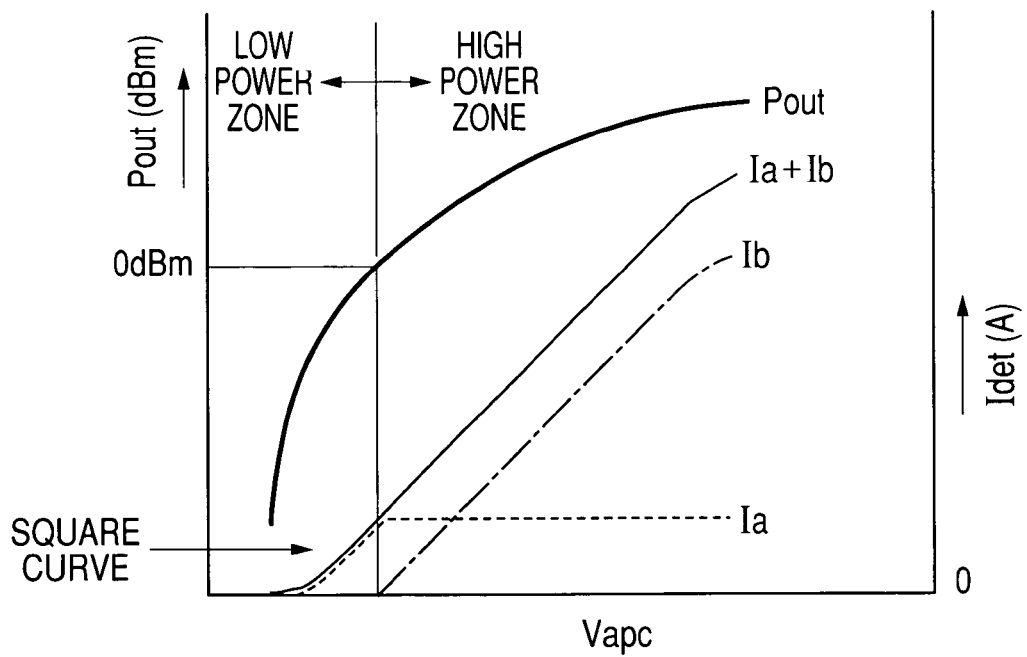
FIG. 10 is a graph showing the relation between the output control voltage Vapc and generated current Ia in a current generating circuit for increasing sensitivity of the second embodiment, and the output power control characteristic of a power module to which the output power detection circuit of the second embodiment is applied.

The DC components are subtracted from the detected voltage by the subtraction circuit 225, the resultant is supplied as the detection voltage Vdet to the error amplifier 250, and the output control voltage Vapc is generated, thereby controlling the output power Pout of the high frequency power amplifier circuit in accordance with the output control voltage Vapc as shown by the solid line in FIG. 10. It is understood from FIG. 10 that by applying the output power detection circuit of the embodiment, the sensitivity to the output control voltage Vapc of the output power Pout in the low power range is improved.

In the second embodiment, the power source voltage Vcc which is the same as that of the detector 221 is used as the power source voltage of the current combining circuit 263. Vcc denotes a constant voltage which is stabler than Vdd. By Vcc, the detection current Idet which is less dependent on power can be obtained.

Further, in the second embodiment, instead of the resistor R1 of the bias generating circuit 223 in the output power detection circuit 220, the constant current source Iref2 is used. The constant current source Iref2 can be constructed by a constant voltage circuit having no temperature dependency like a band gap reference circuit, a transistor for converting generated constant voltage to current, a current mirror circuit for making flow current proportional to the current flowing in the transistor, and the like. By using the constant current source Iref2 in place of the resistor R1, the detection current Ib having low temperature dependency can be obtained.

Also in the second embodiment, it is possible to provide the limiter LIM (refer to FIG. 2) similar to that of the first embodiment at the ante stage of the transistor Q20 for detection to limit the gate voltage and perform a control of suppressing the maximum power as shown in FIG. 3A.

Figure 8:
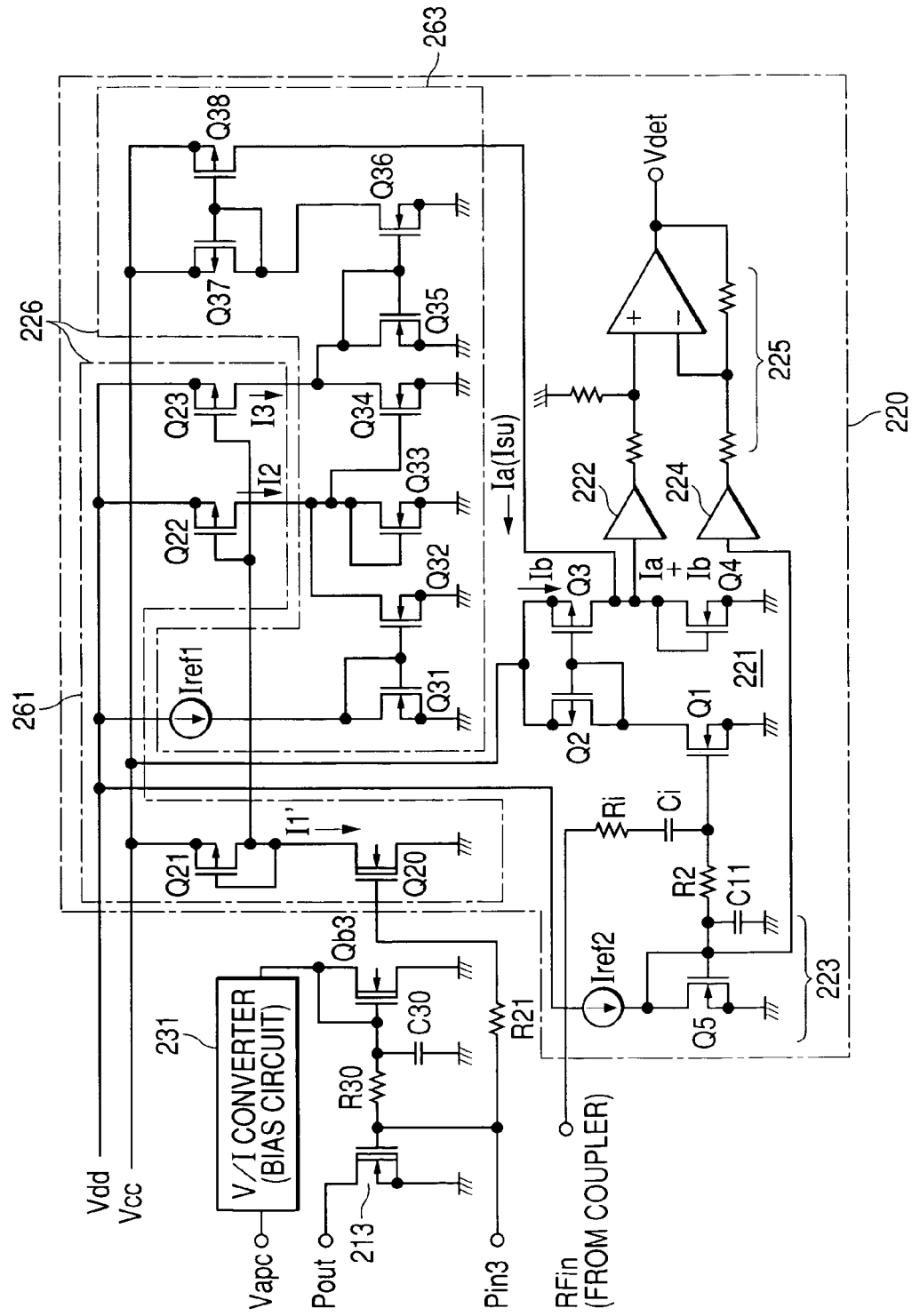
FIG. 8 is a circuit configuration diagram showing a modification of the second embodiment.

FIG. 8 shows a modification of the second embodiment. In the second embodiment of FIG. 7, the bias circuit 230 is constructed by a resistance voltage divider and the gate bias voltage of the transistors 211 to 213 for amplification is generated by dividing the output control voltage Vapc output from the error amplifier 250 at a resistance ratio. In contrast, in the modification of FIG. 8, a transistor Qb3 for bias whose gate is connected to the gate of the transistor 213 for amplification via a resistor, thereby constructing a current mirror circuit is provided.

In addition, the gate bias circuit 230 converts the output control voltage Vapc output from the error amplifier 250 to current, adjusts the current so as to achieve a desired current ratio by the current mirror circuit, and makes the current flow to the transistor Qb3 for bias, thereby applying the bias by making the current according to Vapc flow to the transistor 213 for amplification by the current mirror method. To prevent the AC component in the high frequency signal Pin3 to be input to the gate of the transistor 213 for amplification from being transmitted to the gate of the transistor Qb3 for bias, thereby causing fluctuations in the bias current, a filter circuit constructed by a resistor R30 and a capacitor C30 is provided.

Figure 9:
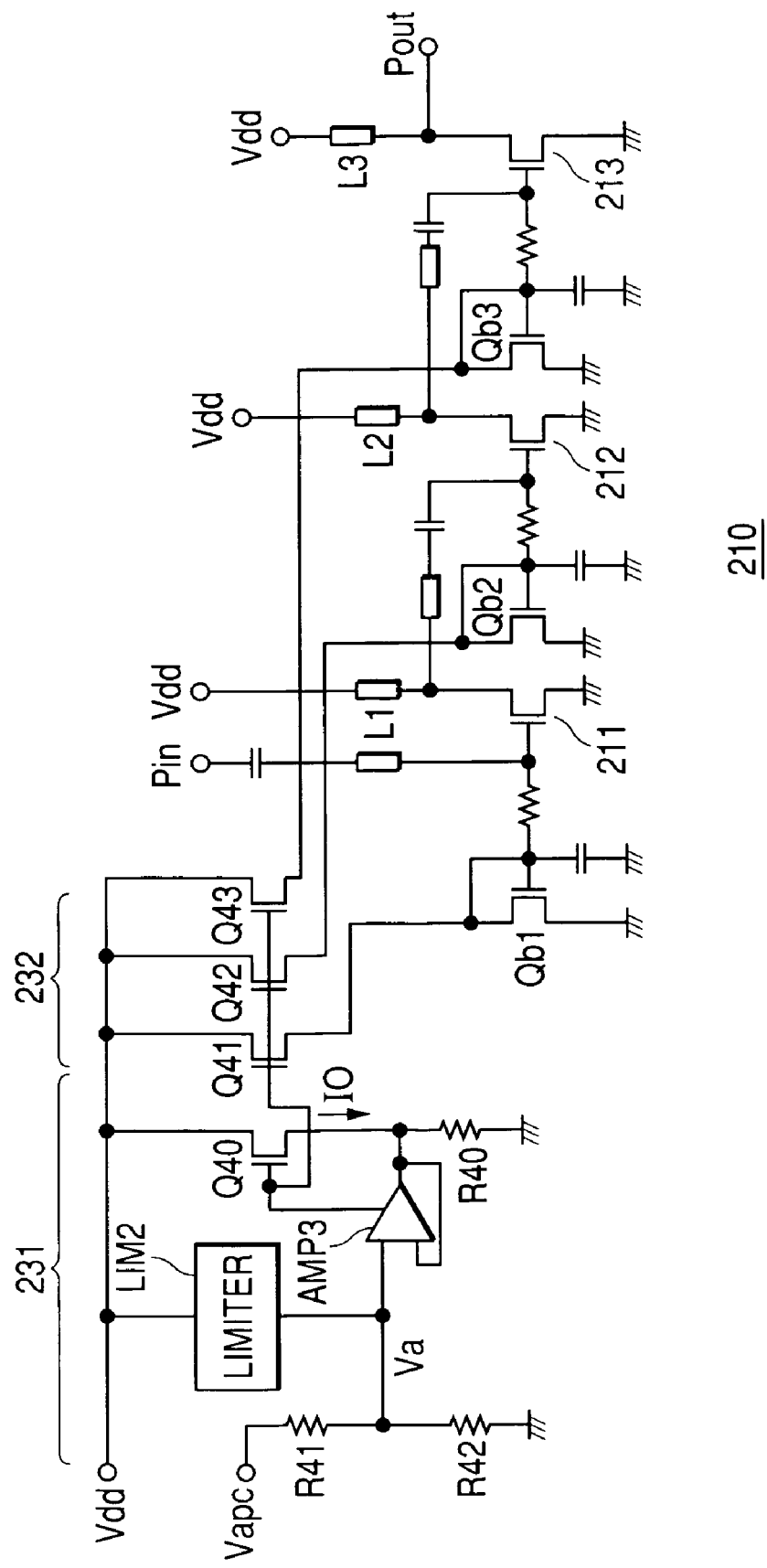
FIG. 9 is a circuit configuration diagram showing an example of a bias circuit for applying bias voltage to the gate of a transistor for amplification in the modification of FIG. 8 by a current mirror method.

As shown in FIG. 9, transistors Qb1 and Qb2 for bias whose gates are connected to the gates of the transistors 211 and 212 for amplification in the first and second stages are also provided, and the gate bias circuit 230 converts the output control voltage Vapc to current, adjusts the current so as to achieve a desired current ratio by the current mirror circuit, and makes the current flow to the transistors Qb1 and Qb2 for bias. In such a manner, the current according to Vapc can flow to the transistors 211 and 212 for amplification to apply the bias voltage.

In the modification of FIG. 9, the bias circuit 230 is constructed by a voltage-current converter 231 for generating current proportional to Vapc on the basis of the input bias control voltage Vapc and a bias current generator 232 for converting the converted current to current according to the size ratio of the transistors.

The voltage-current converter 231 includes series resistors R41 and R42 for dividing the bias control voltage Vapc, a differential amplifier AMP3 having a non-inversion input terminal to which a voltage Va divided by the resistors R41 and R42 is applied, a limiter LIM2 for limiting the upper limit of the input voltage Va of the differential amplifier AMP3, and a MOS transistor Q40 and a resistor R40 connected in series between the power source voltage Vdd and the ground point. The transistor Q40 and the resistor R40 can be regarded as an output stage of the differential amplifier AMP3.

In the voltage-current converter 231 of the embodiment, potential V0 at the connection node between the transistor Q40 and the resistor R40 is fed back to the inversion input terminal of the differential amplifier AMP3, thereby passing current I0 for making the potential V0 match with the input voltage Va of the differential amplifier AMP3 to the MOS transistor Q40. To transistors Q41, Q42, and Q43 having gates to which the same gate voltage as that applied to the transistor Q40 is applied, current according to a size ratio with respect to Q40 (the gate width ratio) flows. The drain current of the transistor Q41 flows to the transistor Qb1 for bias which is connected to the transistor 211 for amplification so as to form a current mirror circuit. The currents of the transistors Q42 and Q43 flow to the transistors Qb2 and Qb3 for bias which are connected to the transistors 212 and 213 for amplification so as to form current mirror circuits.

In the modification in FIGS. 8 and 9, the bias circuit 230 for applying the gate bias to the transistors 211 to 213 for amplification is constructed by the voltage-current converter 231 for converting the output control voltage Vapc to current, the bias current generator 232 constructed by the MOS transistors Q41 to Q43, and the transistors Qb1 to Qb3 for bias. Naturally, to reduce consumption current, as the transistors Qb1 to Qb3 for bias, devices smaller than the transistors 211 to 213 for amplification are used.

Figure 11:
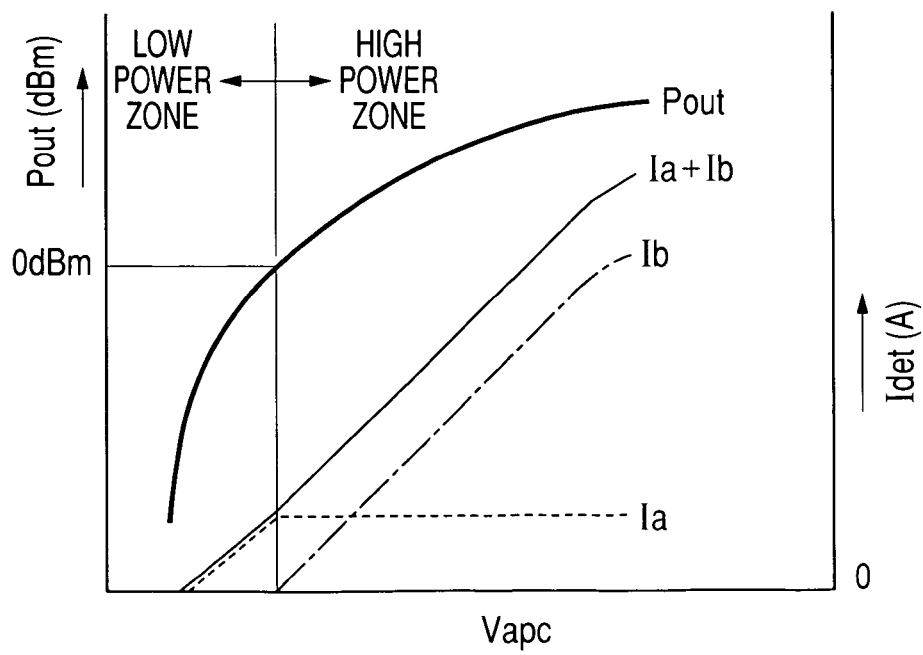
FIG. 11 is a graph showing the relation between the output control voltage Vapc and the generated current Ia in the current generating circuit for increasing sensitivity of the modification of the second embodiment, and the output power control characteristic of a power module to which the output power detection circuit of the modification is applied.

The configuration of the modification is the same as that of the embodiment of FIG. 7 except for the point that the transistors 211 to 213 for amplification are biased by the current mirror method. Therefore, the operation of the current generating circuit 226 for increasing sensitivity is the same as that of the embodiment of FIG. 7. In the embodiment of FIG. 7, the current Isu for increasing sensitivity flowing to the detector 221 changes in a square curve in the low power range. In contrast, in the case of applying the modification of FIG. 8, the current Ia changes almost linearly also in the low power range as shown in FIG. 11. Consequently, the control characteristic closer to that in the case where the current generating circuit 226 for increasing sensitivity of the first embodiment is applied is obtained.

In the modification of FIG. 9, it is also possible to omit the resistors R41 and R42, limiter LIM2, and amplifier AMP3, supply the output control voltage Vapc directly to the gate terminal of the transistor Q40 so as to be converted to current, convert the current into current proportional to the size ratio between the transistor Q40 and the transistors Q41 to Q43, and make the resultant current flow to the transistors Qb1 to Qb3 for bias connected to the transistors 211 to 213 for amplification so as to form current mirror circuits.

EXAMPLE OF APPLICATION

Figure 12:
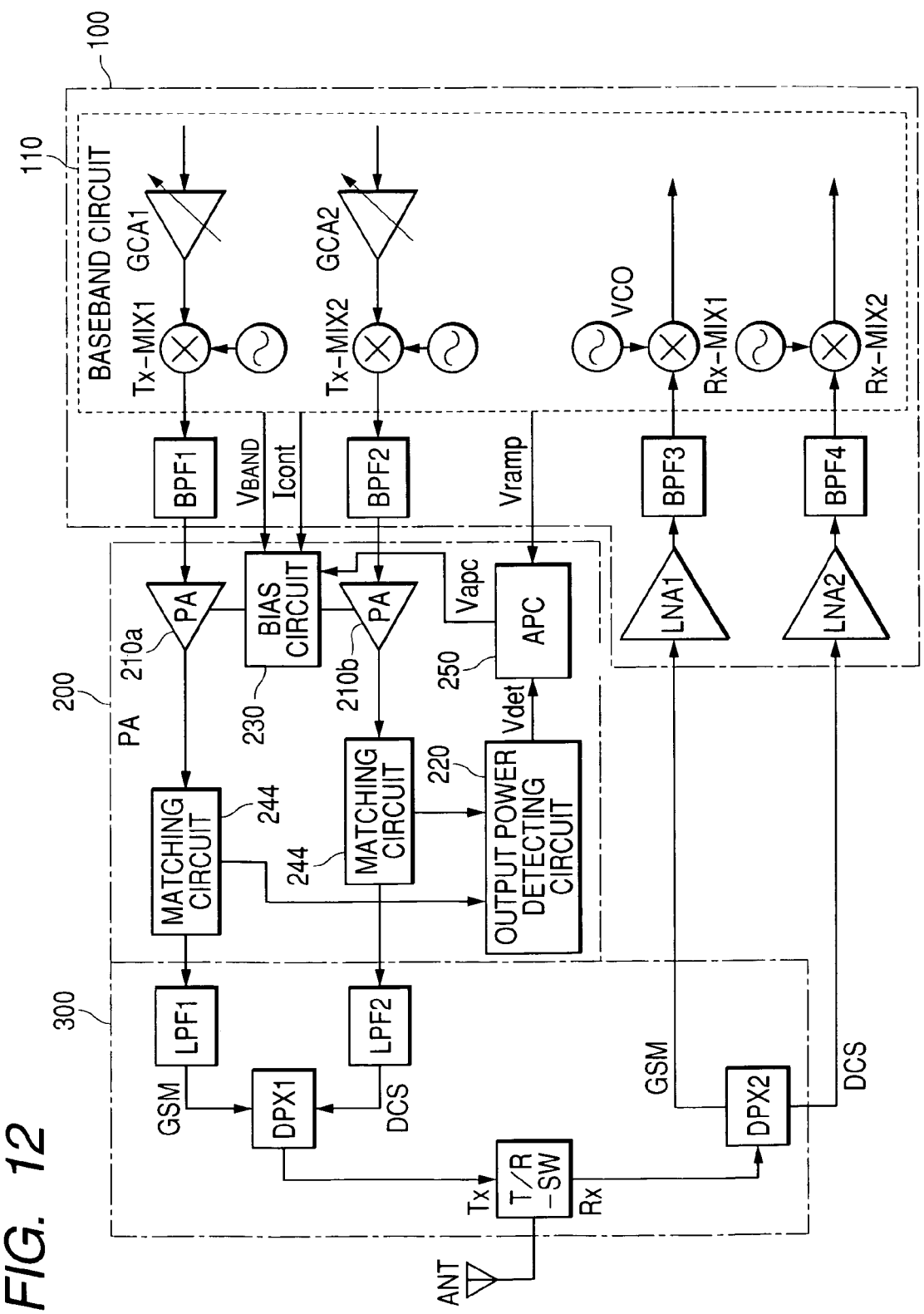
FIG. 12 is a block diagram showing a schematic configuration of a system capable of performing radio communications in two communication systems of GSM and DCS to which the high frequency power amplifier circuit of the invention is applied.

FIG. 12 shows a schematic configuration of a system capable of performing two radio communications in two communication systems of GSM and DCS as an example of a radio communication system which is effective when the power module of the embodiment is applied.

In FIG. 12, ANT denotes an antenna for transmitting/receiving signal electric waves, and 100 denotes an electronic device (hereinbelow, called an RF device) obtained by mounting, into a single package, a high frequency signal processing circuit (baseband circuit) 110 having a modulation/demodulation circuit capable of performing GMSK modulation and demodulation in the GSM and DCS systems and a circuit for generating I and Q signals on the basis of transmission data (baseband signal) and processing I and Q signals extracted from a reception signal, a semiconductor integrated circuit (baseband IC) for processing high frequency signals obtained by forming low noise amplifiers LNA1 and LNA2 for amplifying reception signals and the like on a single semiconductor chip, band pass filters BPF1 and BPF2 for eliminating harmonic components from transmission signals, band pass filters BPF3 and BPF4 for eliminating unnecessary waves from reception signals, and the like. Tx-MIX1 and Tx-MIX2 denote mixers for up-converting GSM and DCS transmission signals, and Rx-MIX1 and Rx-MIX2 denote mixers for down-converting GSM and DCS reception signals.

In FIG. 12, 200 indicates the power module of the foregoing embodiment which amplifies a high frequency signal supplied from the baseband IC 100. 300 denotes a front end module including filters LPF1 and LPF2 for eliminating noise such as harmonics included in a transmission signal, branching filters DPX1 and DPX2 for combining/separating a GMS signal and a DCS signal, and a switch T/R-SW for changing transmission and reception.

As shown in FIG. 12, in the embodiment, a mode selection signal VBAND indicative of GSM or DCS is supplied from the baseband IC 110 to the bias circuit 230, and the bias circuit 230 generates a bias current according to the mode on the basis of the control signal VBAND and supplies the bias current to either a power amplifier 210a or 210b. An output level instruction signal Vramp is supplied from the baseband IC 110 to the APC circuit (error amplifier) 250 in the power module 200. The APC circuit (error amplifier) 250 compares the output level instruction signal Vramp with the detection voltage Vdet from the output power detection circuit 220 and generates the output control signal Vapc to the bias circuit 230. The bias circuit 230 controls the gain of the power amplifiers 210a and 210b in accordance with the output control signal Vapc so that the output power of the power amplifiers 210a and 210b changes accordingly.

In the embodiment, although not shown in FIG. 12, in addition to the above-mentioned devices and modules, a microprocessor (CPU) for controlling the whole system by generating an output level instruction signal which is the base of a control signal to the RF device 100 and the power control signal may be also provided.

Although the invention achieved by the inventors herein has been described concretely on the basis of the embodiments, obviously, the invention is not limited to the embodiments but can be variously modified without departing from the gist.

For example, in the foregoing embodiment, the example of connecting the resistor Ri and the capacitor Ci in series in some midpoint of the microstrip line in the impedance matching circuit 244 to transmit the AC component in the output power to the output power detection circuit 220, thereby detecting the magnitude of the output power has been described. A modification can be also considered such that an AC signal is supplied from the drain terminal or gate terminal of the FET 213 in the final amplification stage or the output terminal OUT of the module, or both the drain terminal of the FET 213 and the output terminal OUT via a capacitor, a resistor, and the like to the gate of the MOS transistor Q1 for detection in the output power detection circuit 220, and the magnitude of the output power is detected. In this case as well, the foregoing embodiment in which the output power detection circuit 220 is provided with the current generating circuit 226 for making current flow which improves sensitivity in the low power range can be applied.

Further, in the foregoing embodiment, the reference current Iref which is necessary in the current combining circuit 263 is supplied from the outside. For example, it is also possible to provide a MOS transistor having a gate for receiving the same gate voltage in parallel with the MOS transistor Q12 in the constant current generating circuit 262 in FIG. 2 and set the size ratio properly, thereby generating the reference current Iref necessary in the current combining circuit 263.

In the high frequency power amplifier circuit of the embodiment, power amplification FETs are connected in three stages. Alternately, the power amplification FETs may be connected in two stages or four or more stages. In the embodiment, LDMOSs are used as the devices 211 to 213 for power amplification. Alternately, other transistors such as MOSFETs, bipolar transistors, GaAs MESFETs, hetero junction bipolar transistors (HBTs), and HEMTs (High Electron Mobility Transistors) may be used. In this case, it is desirable to use the same devices as the transistors 211 to 213 for amplification as the transistor Q1 for detection and the transistor Q2 for current-voltage conversion.

Further, in the embodiment, the case has been described in which the error amplifier (APC circuit) 250 for comparing the output level instruction signal Vramp from the baseband part with the detection voltage Vdet from the output power detection circuit 220 and generating the output control voltage Vapc to the bias circuit 230 is formed on the same semiconductor chip on which the power amplifier circuit 210 and the output power detection circuit 220 are also formed. Alternately, the error amplifier (APC circuit) 250 may be formed on a different semiconductor chip.

The detection voltage Vdet from the output power detection circuit 220 can be supplied from the external terminal P1 to the baseband part and used to generate the control voltage Vapc for controlling the gain of the variable gain amplifier for amplifying a transmission signal by the error amplifier (APC circuit) 250 provided on the baseband part side. The method is effective when applied to a system in which the bias voltage, that is, the gain of the power amplification circuit 210 is fixed and the amplitude of the input signal Pin is amplified in accordance with an output request level.

Although the case of applying the invention achieved by the inventors herein to the power module as a component of the dual-mode radio communication system capable of performing transmission/reception in two communication systems of GSM and DCS as the field of utilization which is the background of the invention has been described, the invention is not limited to the case. The invention can be also used for a power module as a component of a radio communication system such as a multimode portable telephone or mobile cellular phone capable of performing transmission/reception in other communication systems or three or more communication systems such as GSM, DCS, PCS (Personal Communications System), and the like or a high frequency power amplifier circuit and a power module for a wireless LAN.

What is claimed is:

1. A high frequency power amplifier circuit comprising:
   a power amplifying circuit which amplifies a high frequency signal in accordance with an output power control voltage; and
   an output power detection circuit which detects a level of an output power of the power amplifying circuit,
   wherein in a state where said output power control voltage is lower than a predetermined level, said output power detection circuit generates output voltage on the basis of the output power control voltage, and in a state where the output power control voltage is higher than the predetermined level, said output power detection circuit generates the output voltage on the basis of the level of the output power of the power amplifying circuit detected by said output power detection circuit.

2. The high frequency power amplifier circuit according to claim 1, further comprising a current generating circuit for increasing sensitivity which generates current according to said output power control voltage, supplies the generated current to a detector in said output power detection circuit to improve detection sensitivity in a state where said output power control voltage is lower than the predetermined level.

3. The high frequency power amplifier circuit according to claim 2,
   said output power detection circuit comprising:
   a first transistor having a control terminal to which an alternate current signal supplied from an output part of said power amplifier circuit via a coupling capacitor is applied;
   a second transistor connected in series to the first transistor;
   a third transistor connected to the second transistor so as to form a current mirror circuit; and
   a transistor for current-voltage conversion which is connected in series to the third transistor,
   wherein the current generated by said current generating circuit for increasing sensitivity flows to said transistor for current-voltage conversion.

4. The high frequency power amplifier circuit according to claim 3, further comprising:
   a bias generating circuit for giving an operation point to the control terminal of said first transistor; and
   a subtraction circuit for outputting, as a detection signal, voltage according to the difference between voltage obtained by conversion of said transistor for current-voltage conversion and voltage applied to said first transistor by said bias generating circuit.

5. The high frequency power amplifier circuit according to claim 2,
   said current generating circuit for increasing sensitivity comprising:
   a constant current generating circuit for generating offset current of predetermined magnitude on the basis of reference voltage;
   a variable current generating circuit for generating current proportional to the output power control voltage when the control voltage is equal to or higher than a predetermined level on the basis of said offset current and the output power control voltage; and
   a current combining circuit for combining the current generated by the variable current generating circuit with the reference current and outputting current which changes according to a desired characteristic.

6. The high frequency power amplifier circuit according to claim 1, wherein said power amplifier circuit includes a transistor for amplification for amplifying an input high frequency signal, and a bias circuit for applying bias according to said output power control voltage to the control terminal of the transistor for amplification.

7. The high frequency power amplifier circuit according to claim 6, further comprising a control voltage generating circuit for generating said output power control voltage to be supplied to said bias circuit on the basis of the output voltage from said output power detecting circuit and an output level instruction signal supplied from the outside.

8. A high frequency power amplifier circuit comprising:
   a power amplifying circuit which includes an amplification transistor for amplifying an input high frequency signal and amplifies a high frequency signal in accordance with output power control voltage;
   an output power detection circuit which detects a level of an output power of the power amplifying circuit; and
   a bias circuit which gives bias voltage according to said output power control voltage to a control terminal of said amplification transistor,
   wherein in a state where said output power control voltage is lower than a predetermined level, said output power detection circuit generates an output voltage on the basis of the bias voltage at the control terminal of said amplification transistor, and in a state where said output power control voltage is higher than the predetermined level, said output power detection circuit generates the output voltage on the basis of the level of the output power of the power amplifying circuit detected by said output power detection circuit.

9. The high frequency power amplifier circuit according to claim 8, wherein said bias circuit takes the form of a resistive dividing circuit which divides said output power control voltage at a resistance ratio, thereby generating bias voltage to be applied to the control terminal of said amplification transistor.

10. The high frequency power amplifier circuit according to claim 8,
said bias circuit comprising:
a voltage-current converter which converts said output power control voltage to current;
a transistor for bias to which said amplification transistor and the control terminal are commonly connected; and
a bias current generator which generates a bias current proportional to current obtained by conversion of said voltage-current converter,
wherein the bias current generated by said bias current generator is made to flow to said transistor for bias, thereby making flow operation current according to said output power control voltage to said amplification transistor.

11. The high frequency power amplifier circuit according to claim 10, further comprising a control voltage generating circuit which generates said output power control voltage to be supplied to said bias circuit on the basis of the output voltage from said output power detection circuit and an output level instruction signal supplied from the outside.

12. The high frequency power amplifier circuit according to claim 8, wherein said output power detection circuit comprises a detection transistor which receives the bias voltage at the control terminal of said amplification transistor by the control terminal and makes current according to the bias voltage flow, and the transistor for detection is a transistor having the same structure as that of said amplification transistor and formed by the same process as that of said amplification transistor.

* * * * *